(12) United States Patent
Ferrero

(10) Patent No.: US 6,509,743 B1
(45) Date of Patent: Jan. 21, 2003

(54) ACTIVE LOAD OR SOURCE IMPEDANCE SYNTHESIS APPARATUS FOR MEASUREMENT TEST SET OF MICROWAVE COMPONENTS AND SYSTEMS

(76) Inventor: Andrea Ferrero, Via Luca della Robbia, 12 - 10100 Turino (IT)

(*) Notice: Subject to any disclaimer, the term of this patent is extended or adjusted under 35 U.S.C. 154(b) by 0 days.

(21) Appl. No.: 09/592,590

(22) Filed: Jun. 12, 2000

(30) Foreign Application Priority Data

Jun. 15, 1999 (IT) .......................................... MI99A1336

(51) Int. Cl.[7] .............................................. G01R 27/32
(52) U.S. Cl. ..................... 324/637; 324/123 R; 324/127
(58) Field of Search .................................. 324/637, 638, 324/639, 642, 646, 58.5, 76.12, 76.14, 76.56, 123 R, 126, 127, 600, 525; 323/357; 385/24, 89; 359/195

(56) References Cited

U.S. PATENT DOCUMENTS

| | | | | |
|---|---|---|---|---|
| 3,815,011 A | * | 6/1974 | Milkovic | |
| 3,976,868 A | * | 8/1976 | Lane | |
| 4,808,912 A | * | 2/1989 | Potter | |
| 6,249,621 B1 | * | 6/2001 | Sargent | |

* cited by examiner

Primary Examiner—Michael Sherry
Assistant Examiner—Trung Nguyen
(74) Attorney, Agent, or Firm—Young & Thompson

(57) ABSTRACT

An active load or source impedance synthesis apparatus for experimental characterization of electronic components (E) working in the range from 500 MHz to 110 GHz, includes an active loop with at least one amplifier (Am), one magnitude and phase control system (Ra, Rs, one directional coupler (Acc) and a measurement system connected to a device under test (E), where the directional coupler (Acc) is connected after the most significant losses of the measurement system.

6 Claims, 5 Drawing Sheets

ACTIVE LOAD OR SOURCE IMPEDANCE SYNTHESIS APPARATUS FOR MEASUREMENT TEST SET OF MICROWAVE COMPONENTS AND SYSTEMS

FIELD OF THE INVENTION

The present invention regards an active load or source impedance synthesis apparatus. In particular an apparatus of the above type apt to the experimental characterization of radio frequency and microwave components and systems.

It is well known that for design and tuning of transistor and amplifiers, it's necessary to obtain accurate information of the operation parameters thereof by measurements or, where possible, by theory.

Furthermore, the experimental characterization of new transistor it's fundamental for the design of the other components to be linked with the transistor to obtain the desired overall amplifier performances.

DESCRIPTION OF RELATED ART

The microwave (i.e. in the frequency range between about 500 MHz and about 110 GHz) transistor and amplifier characterization techniques can be divided into two main areas: linear characterization and non linear characterization.

The first case deals with the techniques to obtain the two-port network parameters under linear conditions, for example, the scattering parameters. This kind of measurements is based on vector network analyzer which are common instruments since two decades or more.

On the contrary for non linear characterization an established and consolidated method to measure the interesting parameters is still unavailable today.

A part from the traditional methods, based on the simple measurement of input and output power ratio or on the harmonic distortion measurement, in the last ten years a technique, called "Load/Source Pull", has being widely applied.

The "Load/Source Pull" technique is based on the experimental measurement of the optimum load, i.e. of the source or load impedance (in the following we will refer to the load only for brevity) which gives the best value of some parameters (for example, the output power) of a particular device under test. The today commercially available load/source pull systems generally measure the output over input power ratio while varying the load/source impedance. FIG. 1 shows a scheme of a traditional load pull system with passive tuners.

The real time measurement of both the impedance and power levels is needed due to the non linear device conditions which prevents to obtain the optimum loading impedance through theoretical analysis from the S-parameters.

Due to its non linear behavior, a device under test E changes its output power with both the source and loading impedance, thus with only an experimental test set it is possible to measure the optimum loading which gives the proper matching for the desired performances.

Commercially available load/source pull systems are based on coaxial or waveguide mechanical tuners Tp to change the impedance shown to the transistor. A set (Sm) of directional coupler and bias tee is normally added between the transistor reference planes E and the tuners Tp to obtain the measurement signals.

The presence of both the intrinsic tuner loss and especially those of the measurement system prevents to obtain a unity or quasi unity reflection coefficient at the device reference planes, i.e. to obtain low or very low impedance values which are normally necessary to provide the conjugate matching of today transistors.

During the 80', within universities and in some research labs, a new technique, called "active load pull", which overcomes the loss limitations has been developed. This technique provides for electronically synthetizing the source or load impedance shown at the device by substituting the mechanical tuner Tp with an active load loop.

The active load is made with a directional coupler Acc used to sample a signal proportional to the outgoing wave from the device E (see FIG. 2). After being filtered with a filter (Rf) this signal is properly controlled in magnitude and phase (through the variable attenuator Ra and the phase shifter Rs), then amplified and finally injected back towards the device under test. Thank to the amplifier, the reflection coefficient $\Gamma_L$, out of the active loop, can have a magnitude over than 1 (0 dB), which is then reduced to the unity at the device reference plane due to the losses.

Although the use of an amplifier allows to compensate for the measurement system Sm and probe Pr losses, which are between the active loop coupler Acc and the device reference plane A–A', if the loss value is too high unwanted oscillations can start which compromise the use of the entire system.

This inconvenient prevents the use of the active loop technique especially over 20 GHz and up today a simple solution which overcomes the oscillation problem and gives reliable results at high frequencies has not been found.

SUMMARY OF THE INVENTION

The object of the invention is to solve the above drawbacks. In particular, the object is to provide an active loop impedance synthesis apparatus which does not show any parasitic oscillation even above 20 GHz.

This object is carried out through the apparatus described in the appended claims.

In particular, according to the invention, the loop directional coupler is arranged right before the device under test and after the main losses of the measurement system.

The present applicant, could demonstrate, after a theoretical analysis and several experiments, that the measurement system losses which were originally placed between the active load loop and the device under test dramatically affect the loop stability. With the new arrangement, according to the invention, the loss of the measurement system are included inside the loop and only lower the amplifier gain without compromising the stability.

Other characteristic of the invention will become apparent from the detailed description and the theoretical analysis which follows, taken in conjunction with the annexed drawings, in which.

DETAILED DESCRIPTION AND THEORETICAL ANALYSIS

Figure 1:
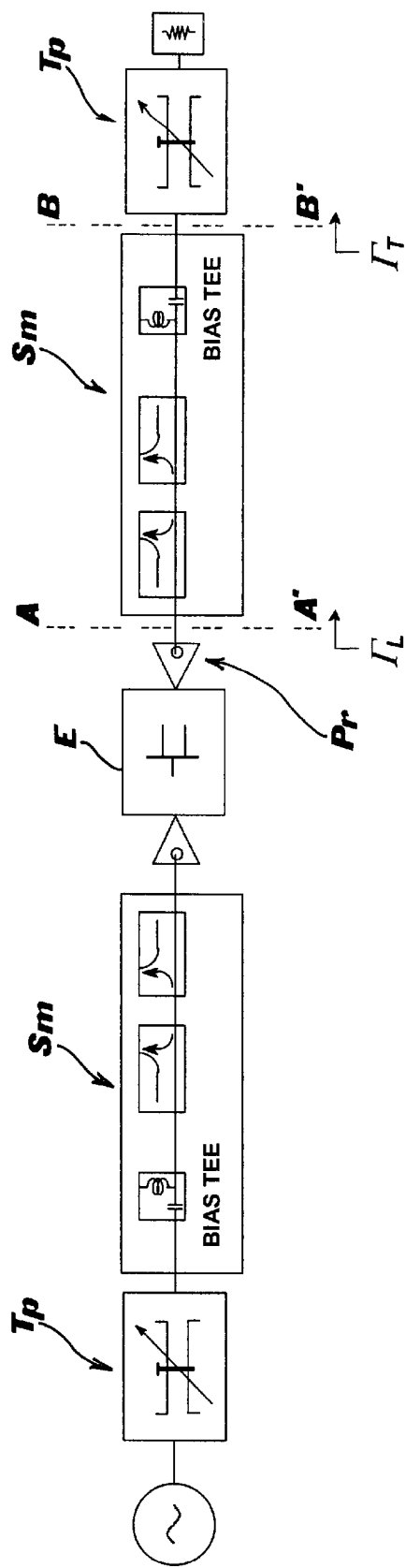
FIG. 1 shows a block diagram of a well know passive load/source pull system.
Figure 2:
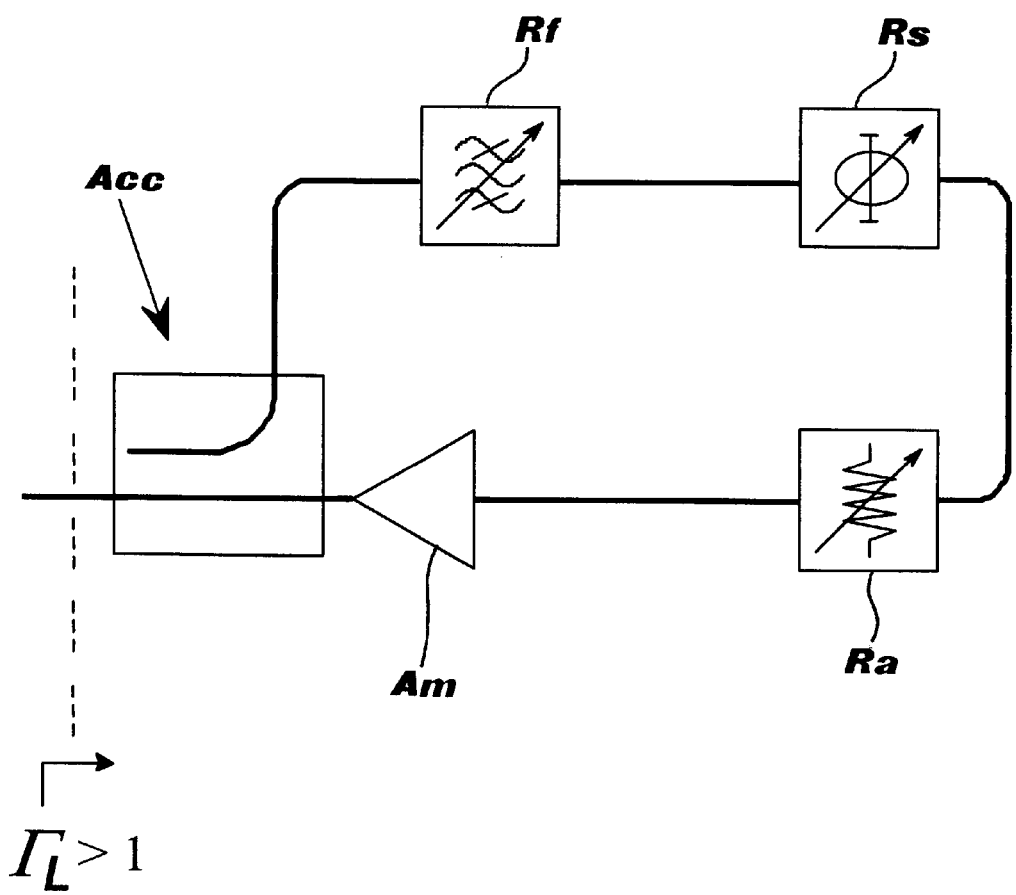
FIG. 2 shows a block diagram of an active loop system according to the known art.
Figure 3:
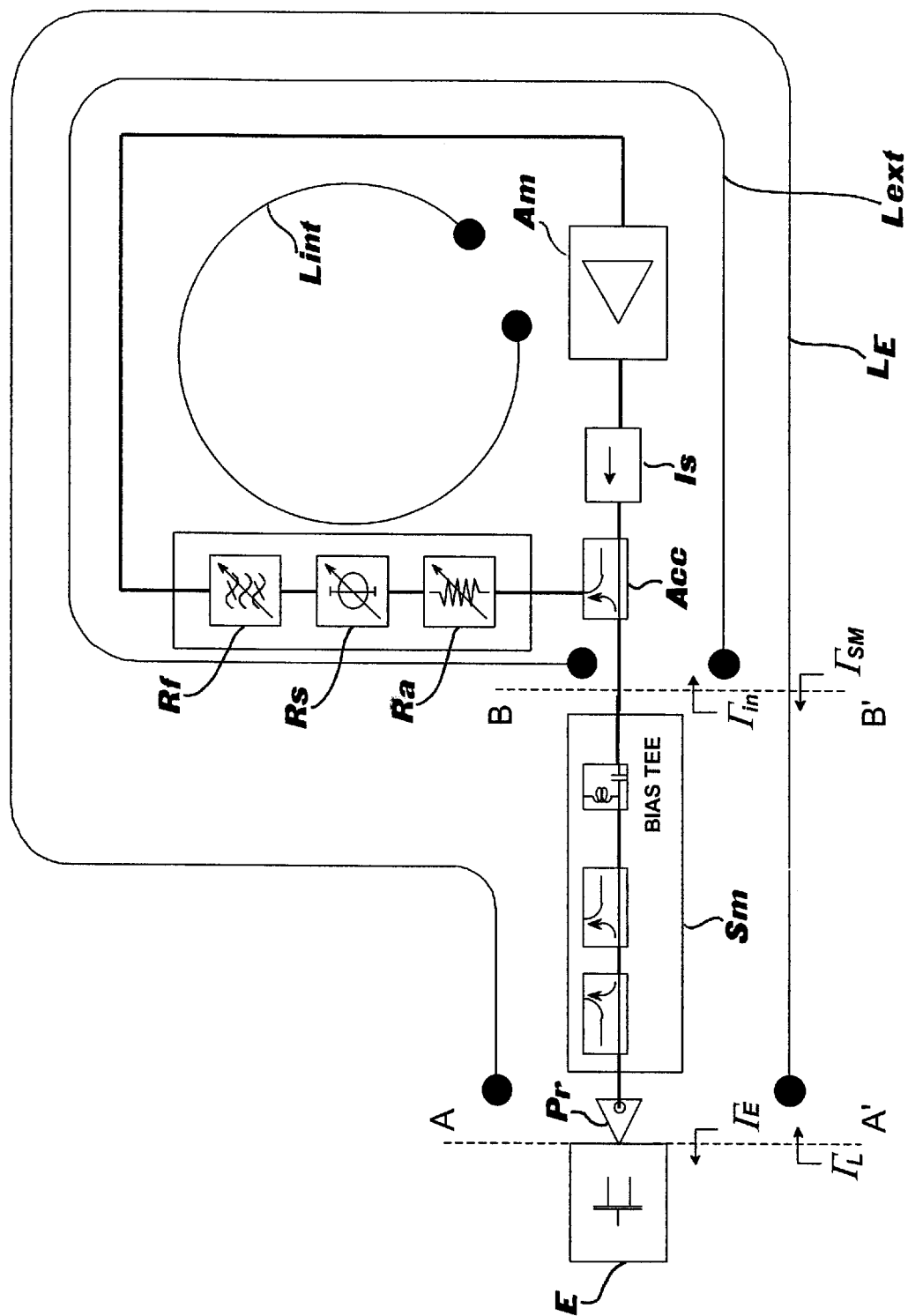
FIG. 3 shows a block diagram of an active loop system of the known art where the parasitic loops which gives instability problems are highlighted.

Considering the known technique shown in FIG. 3 and neglecting the multiple reflection contributions, the undesired oscillation conditions of the system will be analyzed, including the losses from the reference plane A–A' of the device under test E and the section B–B' of the active loop directional coupler Acc.

There are three signal path which can be sources of instabilities:

an internal Loop ($L_{int}$), which includes, the directional coupler Acc, the phase and magnitude control system—schematically represented by a variable attenuator Ra and a variable phase shifter Rs—a narrow band variable filter Rf, an amplifier Am and an isolator Is (which could be neglected in some cases);

an external Loop ($L_{ext}$), comprising the component of the internal loop plus the connection path from the loop to the measurement system Sm;

a device under test loop ($L_E$), which includes the components of the external loop plus the measurement system Sm and a probe Pr, up to the device E reference plane A–A'.

The oscillation conditions of those three loops will be analyze to demonstrate that if high losses of the measurement system are present, it is relatively easy to obtain the instability of the external loop $L_{ext}$.

For all the following analysis it is assumed that the reflection coefficient $\Gamma_L$ shown to the device under test E, never exceeds the unity (i.e. a loading condition). Furthermore it is assumed that outside the pass band of the loop filter Rf, the filter attenuation is so high to cancel the gain of the amplifier Am, thus the system can oscillate only inside the pass band of the filter Rf.

Figure 5:
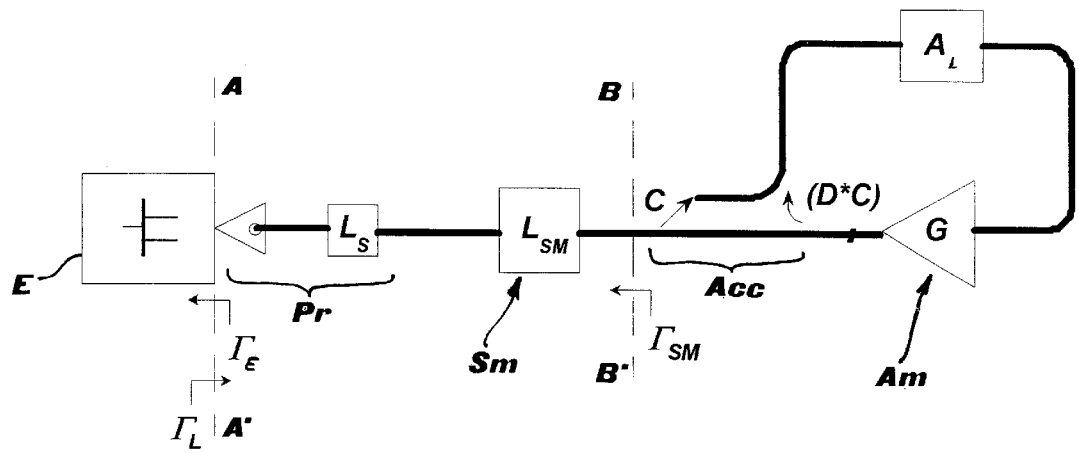
FIG. 5 shows an active loop system of the known art apt to be used for theoretical exposition.

Table 1, referenced to FIG. 5, reports the interesting quantities of the signal paths used for the analysis.

TABLE 1

| Description | | Symbol |
|---|---|---|
| Overall Loop Attenuation coefficient given by | Filter Variable attenuator Phase Shifter Internal Cable Loss | $A_L$ |
| Loop coupler Coupling coefficient | | C |
| Loop coupler Directivity | | D |
| Loop Amplifier Gain | | G |
| Measurement system Losses | | $L_{SM}$ |
| Probe Losses | | $L_S$ |
| Overall Loop Gain | | $G_L$ | where for the directional coupler, the following S parameter matrix is assumed:

$$S = \begin{bmatrix} 0 & S_{21} & S_{31} \\ S_{21} & 0 & S_{23} \\ S_{31} & S_{23} & 0 \end{bmatrix}$$

$$C = S_{21} = S_{12} \quad D = \frac{S_{23}}{S_{21}}$$

The internal loop $L_{int}$ is based on the series of the components which form the actual active load.

Thus the gain of the internal loop is given by:

$$G_{Lint} = C \cdot G \cdot D \cdot A_L \quad (1.1)$$

To ensure the stability of this loop, $G_{int}$ must be less than 1, thus the following condition for the amplifier gain G stands:

$$G < \frac{1}{C \cdot D \cdot A_L} \quad (1.2)$$

Considering the external loop $L_{ext}$ and let $\Gamma_{SM}$ the reflection coefficient of the measurement system shown at section B–B' of the directional coupler, the gain of this loop is given by:

$$G_{Lext} = \Gamma_{SM} \cdot C \cdot A_L \cdot G \quad (2.1)$$

Finally, considering the device under test loop $L_E$, the stability condition at reference plane A–A' implies that:

$$\Gamma_L * \Gamma_E < 1 \quad (3.1)$$

This condition is always satisfied because $\Gamma_E < 1$ for definition (i.e. the device under test output reflection coefficient less than one) and the maximum load shown to the device by the system is assumed to be $\Gamma_L = 1$.

Let $L_{SM}$ the measurement system losses and $L_S$ the probe losses given by Pr (see FIG. 5) we have:

$$\Gamma_L = G \cdot (L_{SM} \cdot L_S)^2 \cdot C \cdot A_L \quad (3.2)$$

Thus the expression for loop amplifier gain which give the maximum load reflection coefficient ($\Gamma_L = 1$), becomes:

$$G = \frac{1}{(L_{SM} \cdot L_S)^2 \cdot C \cdot A_L} \quad (3.3)$$

At this point it is necessary to verify whether this gain value does not give instability of one of the two loops $L_{int}$ and $L_{ext}$; by substituting expression 3.3 inside 1.2 the condition $$\frac{D}{(L_{SM} \cdot L_S)^2} < 1 \quad (3.4)$$

it is obtained. Thus $$D < (L_{SM} \cdot L_S)^2 \quad (3.5)$$

Reminding that for this analysis the directivity is defined with the opposite sign of the usual directional coupler directivity definition, i.e. as:

$$D_{dB} = \left(\frac{S_{23}}{S_{21}}\right)_{dB} \quad (3.6)$$

Equation 3.5 can now be rewritten considering decibel in the form:

$$D|_{dB} < 2(L_S|_{dB} + L_{SM}|_{dB}) \quad (3.7)$$

If, for example there are −3 dB of total loss (Ls=−0.5 dB and Lsm=−2.5 dB), a directivity of −6 dB is required. Considering the overall external loop gain $G_{Lext}$ given by equation 2.1 and substituting the amplifier gain of equation 3.3 which is necessary to obtain a unity load reflection coefficient, the stability condition for the external loop ($G_{Lext} < 1$) is obtained as:

$$\Gamma_{SM}|_{dB} < 2 \cdot (L_S|_{dB} + L_{SM}|_{dB}) \quad (3.8)$$

While it's relatively simple to fulfill the condition given by equation 3.7, i.e. having directivity values of −15 dB or better, it is difficult to respect the condition given by the 3.8, which means to have the reflection coefficient shown by the measurement system $\Gamma_{SM}$ at the directional coupler reference plane less than −10 dB (−6 dB is the minimum given by equation 3.8 but some margin it's mandatory), i.e. to have a well match measurement system, especially at high frequencies (above 20 GHz).

Figure 4:
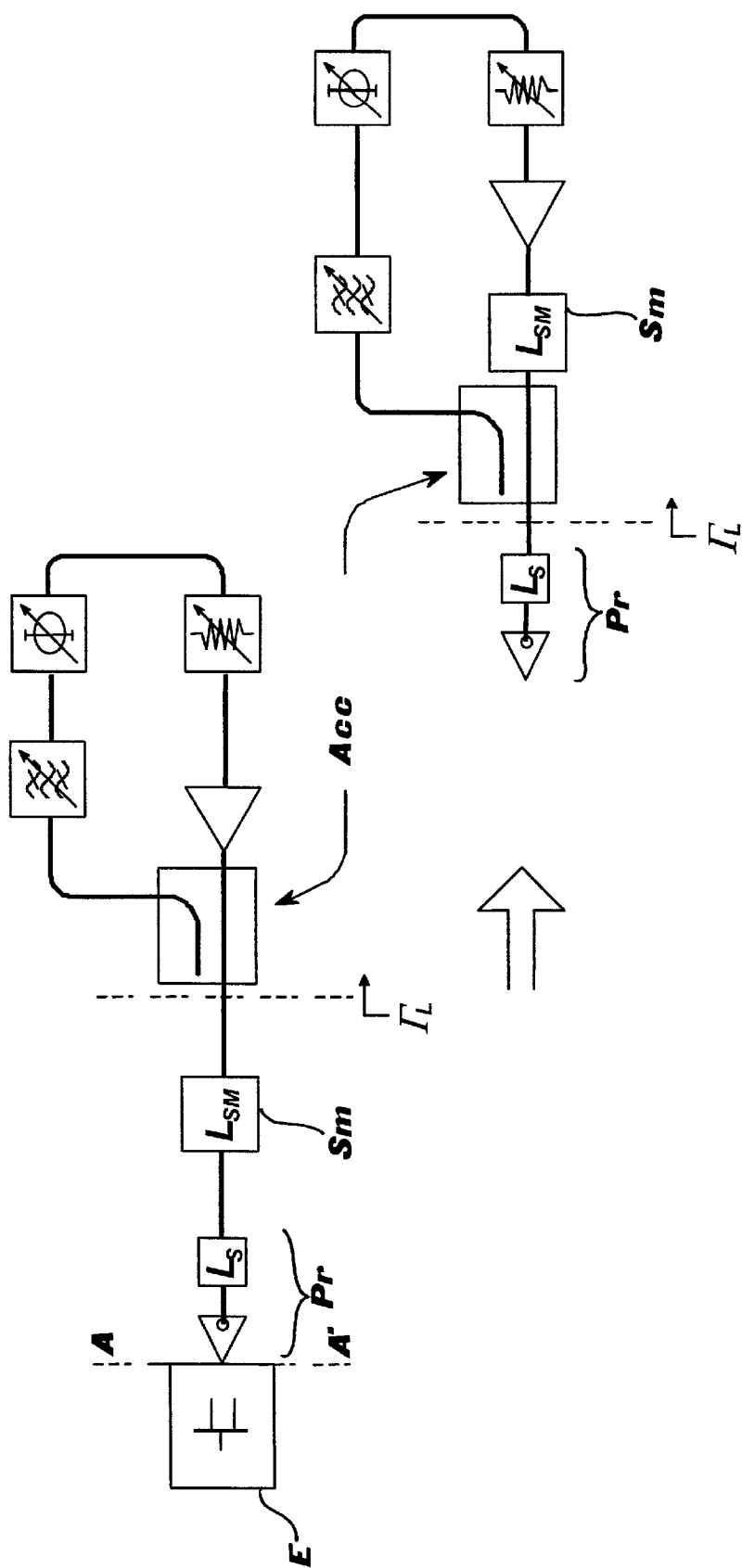
FIG. 4 is a schematic view showing a comparison between an active loop system of the known art and the measurement system according to the invention.

According to the invention this problem is solved by moving the loop directional coupler Acc forward of the most significant losses of the measurement system, right before the probe Pr as shown in FIG. 4.

Figure 6:
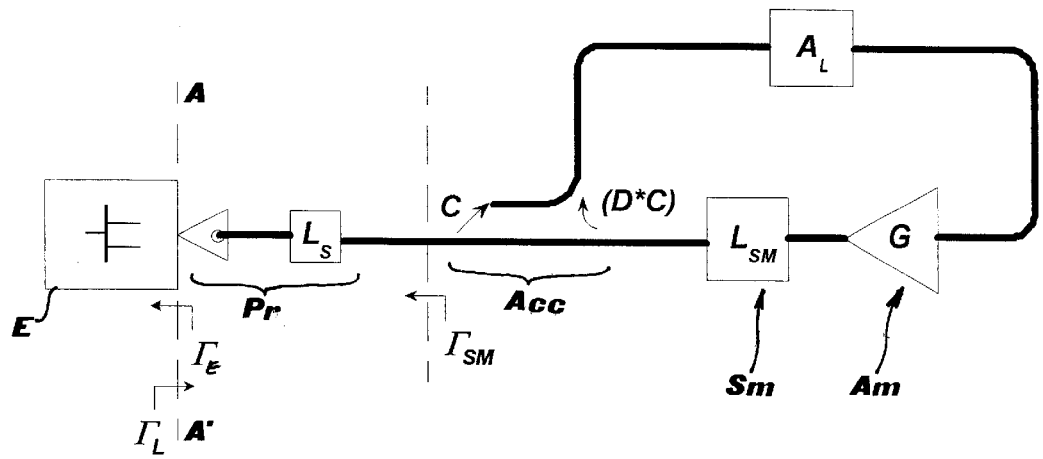
FIG. 6 shows an active loop system according to the invention apt to be used for theoretical exposition.

The new arrangement according to the invention, shown in FIG. 6, allows to obtain stability of the external loop without the requirements of low $\Gamma_{SM}$. With the new position of the loop directional coupler it is possible to write the following equation for the internal loop gain:

$$G_{Lint} = G \cdot C \cdot D \cdot A_L L_{SM} \tag{3.9}$$

For the device loop $L_E$, the maximum reflection coefficient condition now becomes:

$$\Gamma_L = C \cdot A_L \cdot G \cdot L_{SM} \cdot L_S^2 = 1 \tag{3.10}$$

which allows to write the following equation for the amplifier gain:

$$G = \frac{1}{C \cdot A_L \cdot L_{SX} \cdot L_S^2} \tag{3.11}$$

By substituting 3.11 in 3.9 and posing the stability condition of the internal loop (i.e. $G_{Lint} < 1$), a relationship similar to 3.5 it's obtained:

$$D < L_S^2 \tag{3.12}$$

where, this time, there is only the loss due to the probe Pr, which is much less than that due to the entire measurement system Sm. Given the directivity in dB, as defined by 3.6, the stability condition for the internal loop becomes:

$$D|_{dB} < 2 \cdot L_S|_{dB} \tag{3.13}$$

and hence, as done before with the 3.8 for the known art:

$$\Gamma_{SM}|_{dB} < 2 \cdot L_S|_{dB} \tag{3.14}$$

Now it is evident that the loop directional coupler Acc shifting, taught by the inventor, results in stability conditions which are more easy to fulfill in terms of directional coupler directivity (equation 3.13) and reduces the overall measurement system matching requirements of a factor which is around two time the loss ($2^*L_{SM}$) thus making this technique available for higher frequencies where the loss factor are more relevant.

From another point of view, the invention can be seen as the integration of the measurement system Sm inside the active loop: in this way the measurement losses just diminished the loop amplifier gain and does not compromise the loop stability.

Finally it is to be noted that the great functionality improvements of the invention, are obtained by a new arrangement of known elements which is not obvious, nor intuitive, and gives the long felt result of assuring the desired loop stability searched since long time ago.

It is intended that the invention is not limited to the particular embodiment shown above, but many other variations can be applied by a technical expert of the field without departing from the scope and spirit of the invention.

For example the probe Pr can be omitted when coaxial components are measured. In this case the device under test E is directly connected to the loop coupler: the loop stability is even more improved since no loss are present between the loop coupler and the device under test (Ls=0).

What I claim is:

1. Active Load or Source Impedance Synthesis Apparatus for experimental characterization of an electronic device under test (E) working in the frequency band from about 500 MHz to about 110 GHz, comprising:

an active load loop having at least an amplifier (Am) operatively connected to a directional coupler (Acc) and to a measurement system which can be connected to said device under test (E), the amplifier, directional coupler, and measurement system being arranged so that a signal to be treated in the active load loop from the device under test (E) is sampled by the directional coupler (Acc), is amplified by the amplifier (Am), and is injected back towards the device under test (E) through the coupler (Acc), the most significant losses (LSM) of said measurement system being intermediate the directional coupler and the amplifier.

2. Apparatus as in claim 1, in which the coupler (Acc) is arranged between the measurement system (Sm) and a probe (Pr) connected to the device under test (E).

3. Apparatus as in claim 1, in which the directional coupler (Acc) is connected directly to the device under test (E).

4. Apparatus as in claim 1, in which said measurement system is integrated inside the active loop.

5. An active load or source impedance synthesis apparatus for experimental characterization of an electronic device under test (E) working in the frequency band from about 500 MHz to about 110 GHz, comprising:

an active load loop having output terminals, for connection to an electronic device under test, the active load loop comprising an amplifier operatively connected to a measurement system and thereafter to a directional coupler (Acc), the amplifier, measurement system, and directional coupler being arranged so that a signal to be tested in the active load loop from the device under test is sampled by the directional coupler, then amplified by the amplifier, then passed through the measurement system, and thereafter injected back towards the device under test through the directional coupler, the most significant losses of the measurement system being intermediate the directional coupler and the amplifier.

6. An active load or source impedance synthesis apparatus for experimental characterization of an electronic device under test (E) working in the frequency band from about 500 MHz to about 110 GHz, comprising:

an active load loop comprising an amplifier;

a directional coupler, arranged to sample a signal from the device under test (E), to circulate said signal in the active loop, and to inject back said signal towards said device under test; and a measurement system connected to the directional coupler, the most significant losses of the measurement system being inside the active loop.

* * * * *